US012813272B2

(12) United States Patent
Han et al.

(10) Patent No.: US 12,813,272 B2
(45) Date of Patent: Nov. 24, 2026

(54) SEMICONDUCTOR PACKAGE COMPRISING STIFFENER AND SCREW

(71) Applicant: SAMSUNG ELECTRONICS CO., LTD., Suwon-si (KR)

(72) Inventors: Insik Han, Suwon-si (KR); Shle-Ge Lee, Suwon-si (KR); Junho Lee, Suwon-si (KR); Wansun Kim, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 362 days.

(21) Appl. No.: 18/425,010

(22) Filed: Jan. 29, 2024

(65) Prior Publication Data

US 2025/0022772 A1 Jan. 16, 2025

(30) Foreign Application Priority Data

Jul. 14, 2023 (KR) ........................ 10-2023-0091791

(51) Int. Cl.

*H10W 40/60* (2026.01)
*H10B 80/00* (2023.01)
*H10W 20/40* (2026.01)
*H10W 90/00* (2026.01)
*H10W 72/00* (2026.01)

(Continued)

(52) U.S. Cl.

CPC .......... *H10W 40/611* (2026.01); *H10B 80/00* (2023.02); *H10W 20/40* (2026.01); *H10W 90/00* (2026.01); *H10W 40/60* (2026.01); *H10W 72/252* (2026.01); *H10W 72/30* (2026.01); *H10W 72/877* (2026.01); *H10W 72/952* (2026.01); *H10W 74/117* (2026.01); *H10W 74/15* (2026.01); *H10W 90/401* (2026.01); *H10W 90/701* (2026.01);

(Continued)

(58) Field of Classification Search

CPC ............. H10W 42/121; H10W 40/611; H10W 74/10–117; H10W 74/121; H10W 74/43; H10W 76/00; H10W 76/10–12; H10W 76/17–18

See application file for complete search history.

(56) References Cited

U.S. PATENT DOCUMENTS 7,443,026 B2 10/2008 Goldmann et al.
8,143,721 B2 3/2012 Ongchin et al.

(Continued)

FOREIGN PATENT DOCUMENTS

KR 10-2023-0025132 A 2/2023
WO WO-2015098502 A1 * 7/2015 .......... H10W 40/611

*Primary Examiner* — Evan G Clinton
(74) *Attorney, Agent, or Firm* — Morgan, Lewis & Bockius LLP

(57) ABSTRACT

A semiconductor package includes a package substrate. A chip structure is on the package substrate. A stiffener covers the chip structure and the package substrate. Screws fix the stiffener to the package substrate. The stiffener includes a main portion that covers an upper surface of the chip structure. A vertical portion that covers lateral side surfaces of the chip structure. The vertical portion extends from an end of the main portion. An edge portion extending laterally from the vertical portion and covering the upper surface of the package substrate. The screws penetrate the edge portion and the package substrate and couple the edge portion to the package substrate.

20 Claims, 18 Drawing Sheets

(51) Int. Cl.

| | |
|---|---|
| *H10W 72/20* | (2026.01) |
| *H10W 72/30* | (2026.01) |
| *H10W 72/90* | (2026.01) |
| *H10W 74/10* | (2026.01) |
| *H10W 74/15* | (2026.01) |

(52) U.S. Cl.
CPC ........ *H10W 90/724* (2026.01); *H10W 90/734* (2026.01); *H10W 90/736* (2026.01)

(56) References Cited

U.S. PATENT DOCUMENTS

| | | | | |
|---|---|---|---|---|
| 9,275,876 | B2 | 3/2016 | Kim et al. | |
| 10,971,425 | B2 | 4/2021 | Chiu et al. | |
| 2013/0069216 | A1 * | 3/2013 | Miyake | H10W 95/00 257/E23.18 |
| 2018/0199472 | A1 * | 7/2018 | Nakanishi | H05K 7/20963 |
| 2019/0006294 | A1 | 1/2019 | Ong et al. | |
| 2020/0118905 | A1 * | 4/2020 | Chen | H10W 40/22 |
| 2021/0013155 | A1 | 1/2021 | Osgood | |
| 2021/0384100 | A1 * | 12/2021 | Ryu | H10W 40/22 |
| 2021/0407887 | A1 * | 12/2021 | Yu | H10W 40/22 |
| 2023/0046098 | A1 | 2/2023 | Kim et al. | |
| 2025/0293114 | A1 * | 9/2025 | Yu | H10P 72/74 |

* cited by examiner

SEMICONDUCTOR PACKAGE COMPRISING STIFFENER AND SCREW

CROSS-REFERENCE TO RELATED APPLICATIONS

This application claims priority under 35 U.S.C. § 119 to Korean Patent Application No. 10-2023-0091791, filed on Jul. 14, 2023 in the Korean Intellectual Property Office, the disclosure of which is incorporated by reference in its entirety herein.

1. TECHNICAL FIELD

The present inventive concept relates to a semiconductor package, and more particularly relates to a semiconductor package including a stiffener and a screw.

2. DISCUSSION OF RELATED ART

Integrated circuit chips are typically provided with a semiconductor package so that the integrated circuit chips may be applied to circuit boards of electronic products or otherwise combined within an electronic system. In a general semiconductor package, an integrated circuit chip (e.g., a semiconductor chip) may be mounted on a printed circuit board (PCB) and may be electrically connected to the PCB through bonding wires or bumps. Research is being actively conducted to increase the reliability and durability of semiconductor packages along with the development of the electronic industry.

SUMMARY

An object of an embodiment of the present inventive concept is to provide a semiconductor package with increased reliability.

The problem to be solved by an embodiment of the present inventive concept is not limited to the problems mentioned above, and other problems not mentioned will be clearly understood by those skilled in the art from the following description.

According to an embodiment of the present inventive concept, a semiconductor package includes a package substrate. A chip structure is on the package substrate. A stiffener covers the chip structure and the package substrate. Screws fix the stiffener to the package substrate. The stiffener includes a main portion that covers an upper surface of the chip structure. A vertical portion that covers lateral side surfaces of the chip structure. The vertical portion extends from an end of the main portion. An edge portion extending laterally from the vertical portion and covering the upper surface of the package substrate. The screws penetrate the edge portion and the package substrate and couple the edge portion to the package substrate.

According to an embodiment of the present inventive concept, a semiconductor package includes a package substrate. A chip structure is on the package substrate. The chip structure includes a chip substrate, at least one semiconductor chip disposed on the chip substrate and a mold layer covering the chip substrate. A stiffener covers the chip structure and the package substrate. Screws fix the stiffener to the package substrate. Solder balls are bonded to a lower surface of the package substrate. The stiffener includes a main portion that covers an upper surface of the chip structure. A vertical portion covers lateral side surfaces of the chip structure. The vertical portion extends from an end of the main portion. An edge portion extends laterally from the vertical portion and covers the upper surface of the package substrate. The screws penetrate the edge portion and the package substrate and couple the edge portion to the package substrate. A lower end of at least one screw of the screws protrudes below the lower surface of the package substrate. The solder balls are spaced apart from each other by a first distance. An outermost solder ball of the solder balls is positioned closest to the pillar portion. The outermost solder ball and the pillar portion are separated from each other by a second distance. The second distance is in a range of about ⅓ to about ⅔ of the first distance.

According to an embodiment of the present inventive concept, a semiconductor package includes a package substrate. A chip structure is on the package substrate. A stiffener covers the chip structure and the package substrate. Screws fix the stiffener to the package substrate. The stiffener includes a main portion that covers an upper surface of the chip structure. A vertical portion covers lateral side surfaces of the chip structure. The vertical portion extends from an end of the main portion. An edge portion extends laterally from the vertical portion and covers the upper surface of the package substrate. The screws penetrate the edge portion and the package substrate and couple the edge portion to the package substrate. The chip structure includes a chip substrate on the package substrate. A first semiconductor chip and a second semiconductor chip are on the chip substrate. A mold layer covers the first semiconductor chip, the second semiconductor chip and the chip substrate. The first semiconductor chip is a processor chip. The second semiconductor chip is a memory chip. The chip substrate includes connection wiring electrically connecting the first semiconductor chip to the second semiconductor chip.

BRIEF DESCRIPTION OF THE DRAWINGS

Example embodiments will be more clearly understood from the following brief description taken in conjunction with the accompanying drawings. The accompanying drawings represent non-limiting, example embodiments as described herein.

DETAILED DESCRIPTION OF EMBODIMENTS

Hereinafter, to explain the present inventive concept in more detail, non-limiting embodiments will be described with reference to the accompanying drawings.

Figure 1:
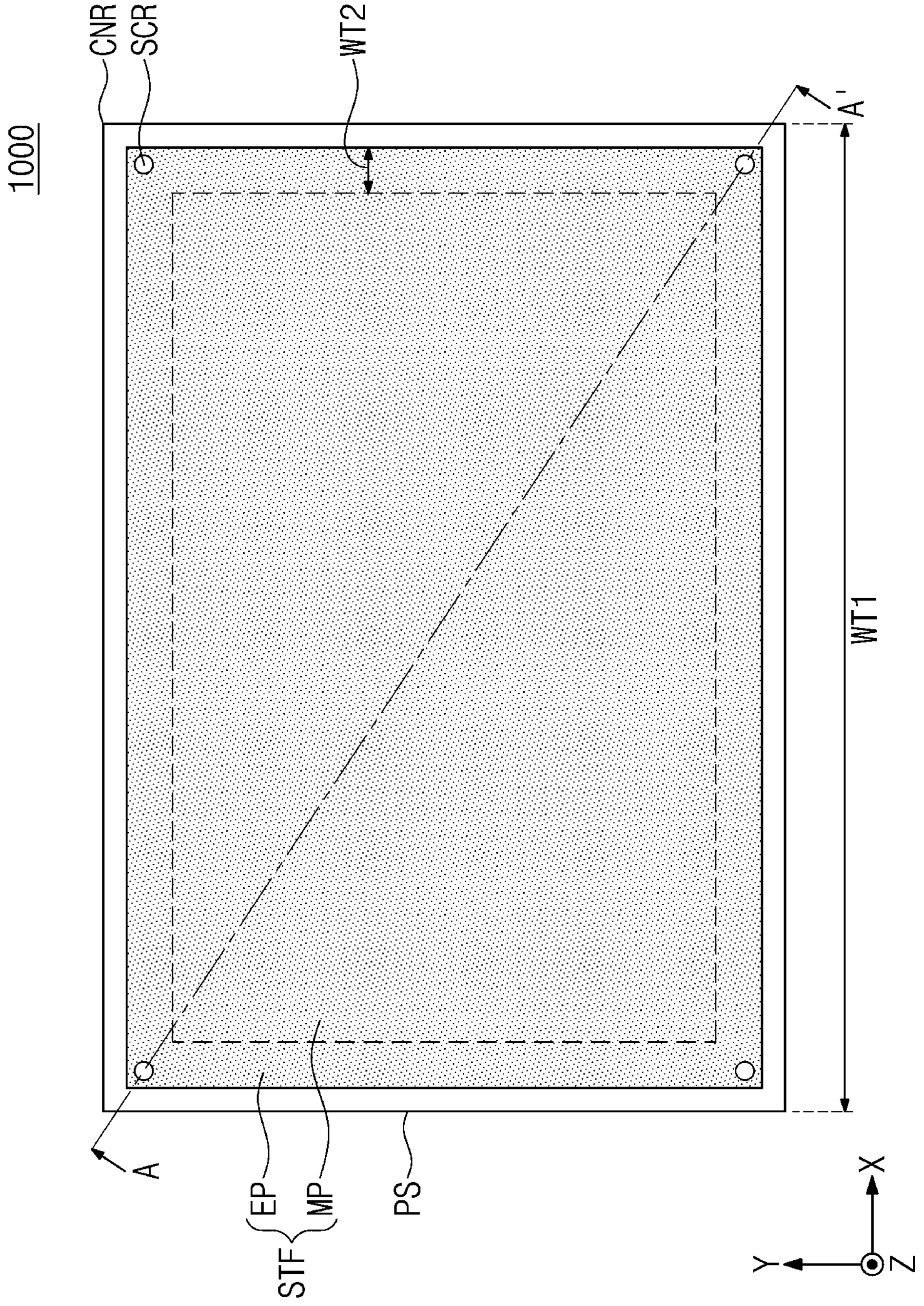
FIG. 1 is a plan view of a semiconductor package according to an embodiment of the present inventive concept.
Figure 2:
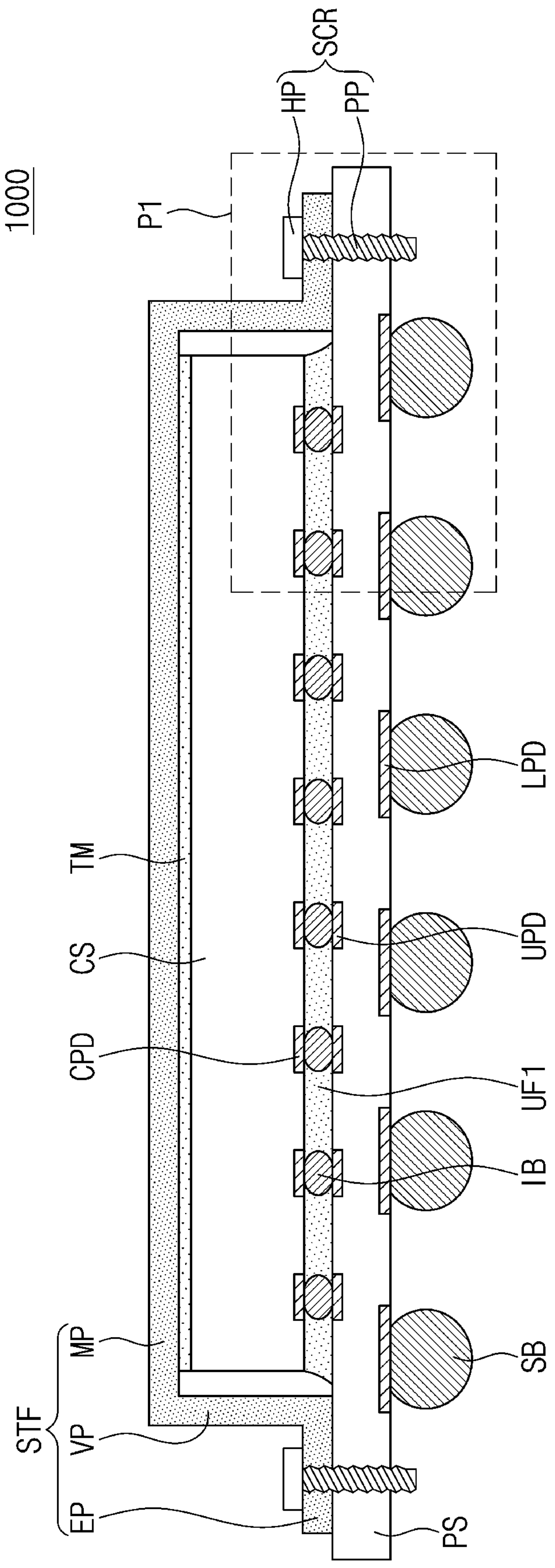
FIG. 2 is a cross-sectional view taken along line A-A' of FIG. 1 according to an embodiment of the present inventive concept.
Figure 3:
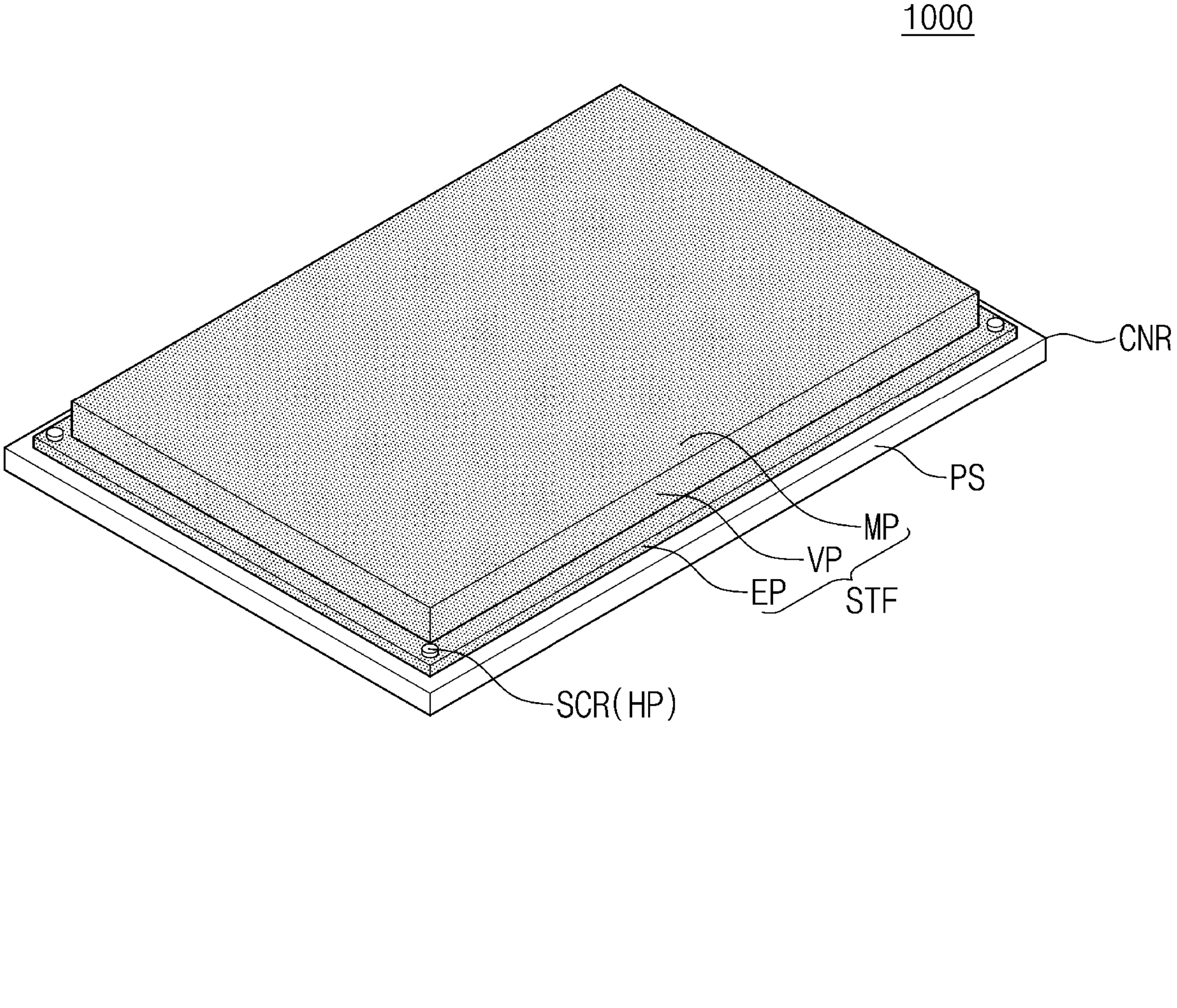
FIG. 3 is a perspective view of a semiconductor package according to an embodiment of the present inventive concept.
Figure 4:
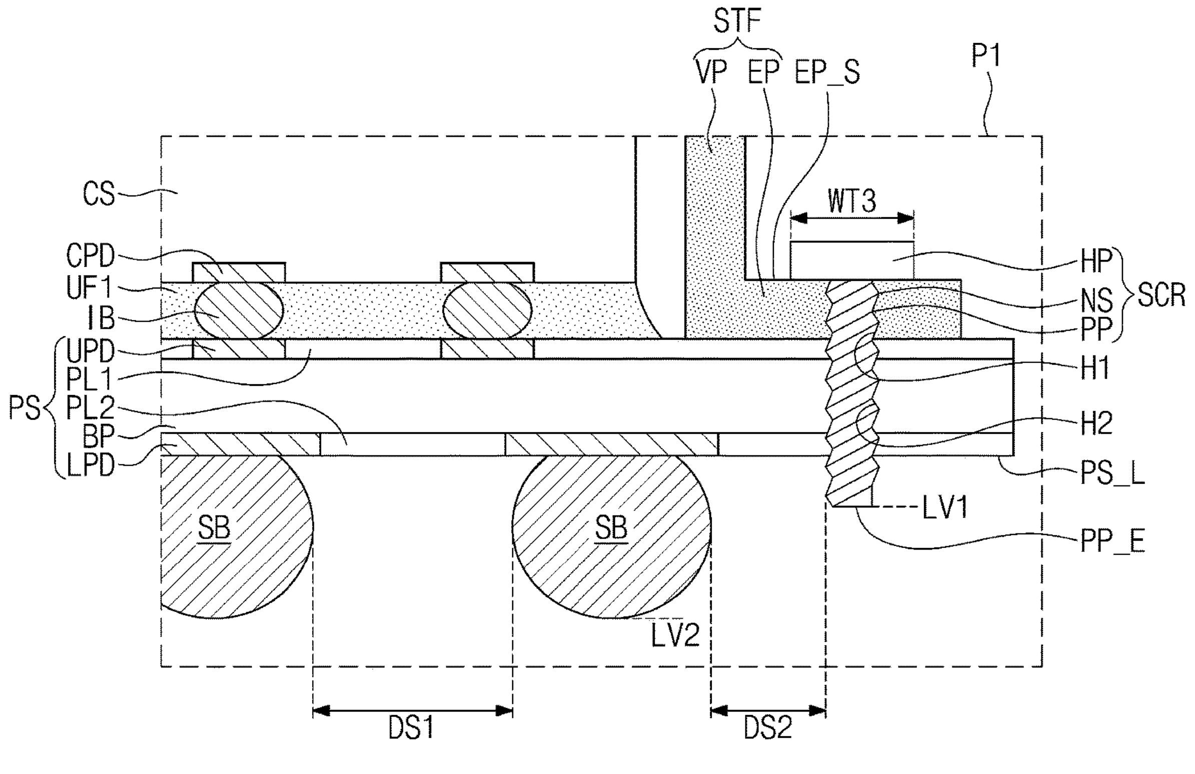
FIG. 4 is an enlarged view of portion 'P1' of FIG. 2 according to an embodiment of the present inventive concept.

FIG. 1 is a plan view of a semiconductor package according to an embodiment of the present inventive concept. FIG. 2 is a cross-sectional view taken along line A-A' of FIG. 1 according to an embodiment of the present inventive concept. FIG. 3 is a perspective view of a semiconductor package according to an embodiment of the present inventive concept. FIG. 4 is an enlarged view of portion 'P1' of FIG. 2.

Referring to FIGS. 1 to 4, the semiconductor package 1000 according to an embodiment may include a first substrate PS, a chip structure CS mounted thereon, a stiffener STF covering the chip structure CS and the first substrate PS, screws SCR for fixing and coupling the stiffener STF to the first substrate PS, and solder balls SB bonded to a lower surface of the first substrate PS.

In an embodiment, the first substrate PS may be, for example, a double-sided or multi-layer printed circuit board. The first substrate PS may be called a 'package substrate.' As shown in FIG. 4, in an embodiment the first substrate PS may include a body layer BP, first substrate upper conductive patterns UPD and a first protective layer PL1 disposed on an upper surface of the body layer BP, and first substrate lower conductive patterns LPD and second protective layer PL2 disposed on a lower surface of the body layer BP. The first substrate PS may have a first width WT1 (e.g., length in a first direction X) when viewed in a plan view of FIG. 1.

In an embodiment, the body layer BP be formed of or include at least one of thermosetting resins (e.g., epoxy resin), thermoplastic resins (e.g., polyimide), composite materials (e.g., prepreg), in which a reinforcement element (e.g., glass fiber and/or inorganic filler) is pre-impregnated with a thermoplastic and/or thermosetting resin matrix, or photo-curable resins. However, embodiments of the present inventive concepts are not necessarily limited thereto. In an embodiment, the first substrate upper conductive patterns UPD and the first substrate lower conductive patterns LPD may include at least one of copper, aluminum, nickel, and gold. However, embodiments of the present inventive concepts are not necessarily limited thereto. In an embodiment, vias may be disposed in the body layer BP, and the first upper substrate conductive patterns UPD may be electrically connected to the first lower substrate conductive patterns LPD by the vias. In an embodiment, the first protective layer PL1 and the second protective layer PL2 may be photo-solder resist (PSR).

In an embodiment, the solder balls SB may be bonded to (e.g., bonded directly thereto) the first lower conductive patterns LPD of the first substrate PS. In an embodiment, the solder balls SB may include SnAg, for example. However, embodiments of the present inventive concepts are not necessarily limited thereto. The solder balls SB may be spaced apart from each other with a first distance DS1.

In an embodiment, the chip structure CS be at least one selected from a system large-scale integration (LSI) chip, a logic circuit chip, an image sensor chip (e.g., a CMOS imaging sensor (CIS)), a memory chip (e.g., FLASH memory chip, DRAM chip, SRAM, chip EEPROM chip, PRAM chip, MRAM chip, ReRAM chip, high bandwidth memory (HBM), chip or hybrid memory cubic (HMC) chip), or a microelectromechanical system (MEMS) element chip, or an application-specific integrated circuit (ASIC) chip. In FIG. 2, one chip structure CS is provided for convenience of explanation. However, in some embodiments more than one chip structure CS may be provided. Chip conductive pads CPD may be disposed on the lower surface of the chip structure CS. In an embodiment, the chip conductive pads CPD may include at least one of copper, aluminum, nickel, and gold. However, embodiments of the present inventive concepts are not necessarily limited thereto.

In an embodiment, the chip structure CS may be connected to the first substrate PS through internal connection members IB. The internal connection members IB connect (e.g., electrically connect) the chip conductive pads CPD to the upper conductive patterns UPD of the first substrate. For example, in an embodiment an upper surface of the internal connection members IB may directly contact the chip conductive pads CPD and a lower surface of the internal connection members IB may directly contact the upper conductive patterns UPD. In an embodiment, the internal connection members IB may be at least one of a solder ball, a conductive bump, and a conductive pillar. In an embodiment, the internal connection members IB may include at least one of copper, tin, and lead. However, embodiments of the present inventive concepts are not necessarily limited thereto. A first underfill layer UF1 may be interposed between the chip structure CS and the first substrate PS. In an embodiment, the first underfill layer UF1 may include a thermosetting resin or a photocurable resin. However, embodiments of the present inventive concepts are not necessarily limited thereto.

In an embodiment, the stiffener STF includes a main portion MP covering the upper surface of the chip structure CS, a vertical portion VP covering a lateral side of the chip structure CS and extending from an end of the main portion MP, and an edge portion EP extending laterally from the vertical portion VP and covering the upper surface of the package substrate PS. In an embodiment, a plane of the stiffener STF may be rectangular (e.g., in the X and Y directions) as shown in FIG. 1. A cross section of the stiffener STF may have a hat shape as shown in FIG. 2. In an embodiment, a thermal expansion coefficient of the stiffener STF may be the same as or different from a thermal expansion coefficient of at least one of the chip structure CS and the first substrate PS. In an embodiment, the stiffener STF may be formed as a single-layer or multi-layer structure of at least one of metals such as Cu, SUS, Ti, and Al, ceramics such as silica, titania, and alumina, engineering plastic, or polymer materials. However, embodiments of the present inventive concepts are not necessarily limited thereto. In an embodiment, the stiffener STF is formed of a metal material with high rigidity and low coefficient of thermal expansion. The stiffener STF may also be named a 'cover', 'heat sink', 'heat slug', or 'heat spreader'.

In an embodiment, a thermal interface material layer TM may be interposed between the main portion MP of the stiffener STF and the upper surface of the chip structure CS. The thermal interface material layer TM may include a thermosetting resin layer. The thermal interface material layer TM may further include filler particles dispersed in the thermosetting resin layer. In an embodiment, the filler particles may include at least one of silica, alumina, zinc oxide, and nitrogen boride. The thermal interface material layer TM may serve to transfer heat generated from the chip structure CS to the stiffener STF and quickly dissipate the heat to the outside (e.g., the external environment). The thermal interface material layer TM may also serve as a buffer to relieve physical stress between the chip structure CS and the stiffener STF.

The stiffener STF may be opaque or transparent. In an embodiment in which the chip structure CS is an image sensor chip, the stiffener STF may be transparent and may transmit light. In this case, the chip structure CS may be spaced apart from the stiffener STF, and the semiconductor package 1000 may exclude the thermal interface material layer TM.

In an embodiment, the vertical portion VP of the stiffener STF may be spaced apart from a lateral side of the chip structure CS. However, embodiments of the present disclosure are not necessarily limited thereto. For example, in an embodiment, the vertical portion VP of the stiffener STF may be in direct contact with a lateral side of the chip structure CS. In another example, a thermal interface material layer and/or an adhesive layer may be interposed between the vertical portion VP of the stiffener STF and the lateral side surface of the chip structure CS.

The edge portion EP of the stiffener STF may have a second width WT2 (FIG. 1) in the first direction X when viewed in a plan view of FIG. 1. In an embodiment, the second width WT2 may be in a range of about 1/100 to about 2/100 of the first width WT1 of the first substrate PS. An upper surface of the edge portion EP of the stiffener STF may be stepped from an upper surface of the main portion MP of the stiffener STF.

The screws SCR penetrate the edge portion EP of the stiffener STF and the first substrate PS, and are in close contact with the edge portion EP of the stiffener STF to the first substrate PS. As shown in an embodiment of FIG. 1, the screws SCR may be disposed adjacent to four corners CNR of the first substrate PS. In an embodiment as shown in FIG. 1, four screws SCR may be provided. However, embodiments of the present disclosure are not necessarily limited thereto. The screws SCR may also be called 'fixing elements. The screws SCR may fix the stiffener STF to the first substrate PS.

As shown in FIG. 4, the screws SCR may each have a head portion HP and a pillar portion PP. The head portion HP protrudes outside an upper surface EP_S of the edge portion EP of the stiffener STF. The head portion HP may have a third width WT3 (e.g., length in the X and/or Y directions). The second width WT2 of the edge portion EP may be greater than the third width WT3 of the head portion HP and may be smaller than about 2/100 of the first width WT1 of the first substrate PS.

The pillar portion PP extends into the edge portion EP of the stiffener STF and the first substrate PS. In an embodiment, screw threads NS are formed on a side of the pillar portion PP. In an embodiment, first holes H1 are formed in the edge portion EP of the stiffener STF into which the pillar portions PP of the screws SCR are inserted therein. The pillar portions PP of the screws SCR extend into the first substrate PS, and second holes H2 overlapping the first holes H1 are formed. Side surfaces of the first holes H1 and the second holes H2 may have profiles that engage the threads NS.

In an embodiment as shown in FIG. 4, a lower end PP_E of the pillar portion PP may have a first level LV1 and may protrude out of (e.g., below) the lower surface PS_L of the first substrate PS (e.g., in the vertical direction, such as the Z direction). However, embodiments of the present disclosure are not necessarily limited thereto. For example, in an embodiment the lower end PP_E of the pillar portion PP may not protrude beyond the lower surface PS_L of the first substrate PS. For example, in an embodiment the lower end PP_E of the pillar portion PP may be co-planar (e.g., in the vertical direction, such as the Z direction) with the lower surface PS_L of the first substrate PS.

An outmost solder ball SB of the solder balls SB may be closest to one of the screws SCR. A second distance DS2 between the one of the screws SCR and the outmost solder ball SB may be in a range of about 1/3 to about 2/3 of the first distance DS1 between adjacent solder balls SB. The lower ends of the solder balls SB may have a second level LV2. In an embodiment, the first level LV1 is higher than the second level LV2. For example, the lower end PP_E of the pillar portion PP positioned at the first level LV1 may be closer to the lower surface PS_L of the first substrate PS in the vertical direction (e.g., the Z direction) than the lower ends of the solder balls SB positioned at the second level LV2.

The semiconductor package 1000 according to an embodiment includes the screws SCR for fixing/fastening the stiffener STF to the first substrate PS. Before the stiffener STF is fastened, the first substrate PS on which the chip structure CS is mounted may be warped due to differences in thermal expansion coefficients of each component. The warpage is more likely to occur as the first width WT1 of the first substrate PS becomes larger. In an embodiment of the present inventive concept, while fastening the stiffener STF to the corner CNR of the first substrate PS, the screws SCR may be tightened to generate pre-bending, thereby effectively suppressing/controlling/minimizing/alleviating the warpage. In addition, while fastening the stiffener STF to the corner CNR of the first substrate PS, the upper surface of the chip structure CS and the lower surface of the main portion MP of the stiffener STF may come into contact (e.g., indirect contact with the thermal interface material layer TM interposed therebetween), and the main portion MP of the stiffener STF may press on the upper surface of the chip structure CS, thereby effectively suppressing/controlling/minimizing/alleviating the warpage. As the warpage is suppressed, non-connection (e.g., non-wet) between the solder balls SB and a module substrate may be decreased. As a result, a semiconductor package 1000 with increased reliability may be provided.

Figure 5A:
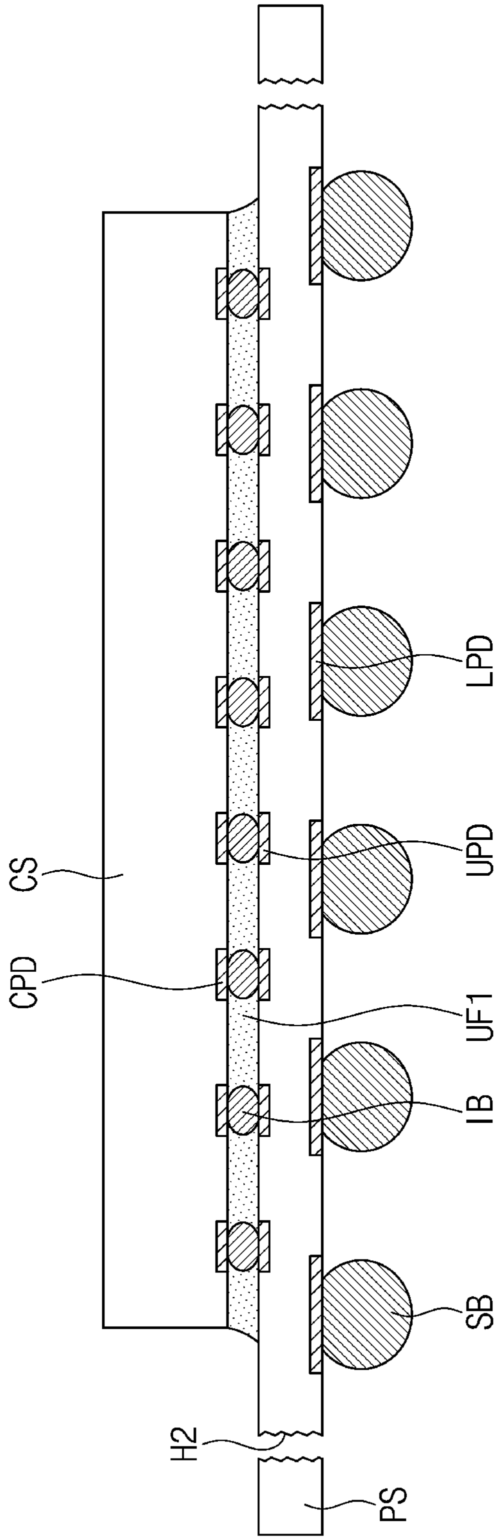
FIGS. 5A and 5B are cross-sectional views showing a process for manufacturing a semiconductor package having the cross-section of FIG. 2 according to embodiments of the present inventive concept.
Figure 5B:
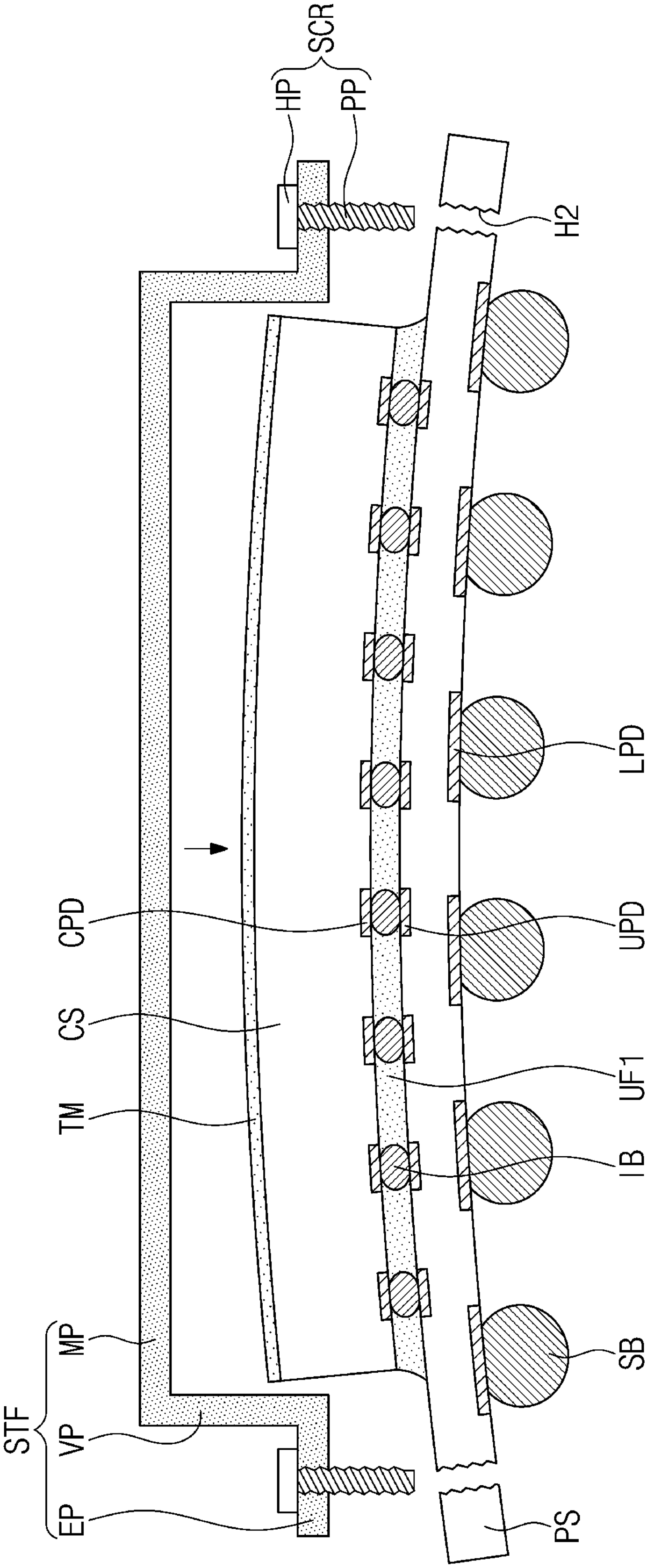
Figure 6:
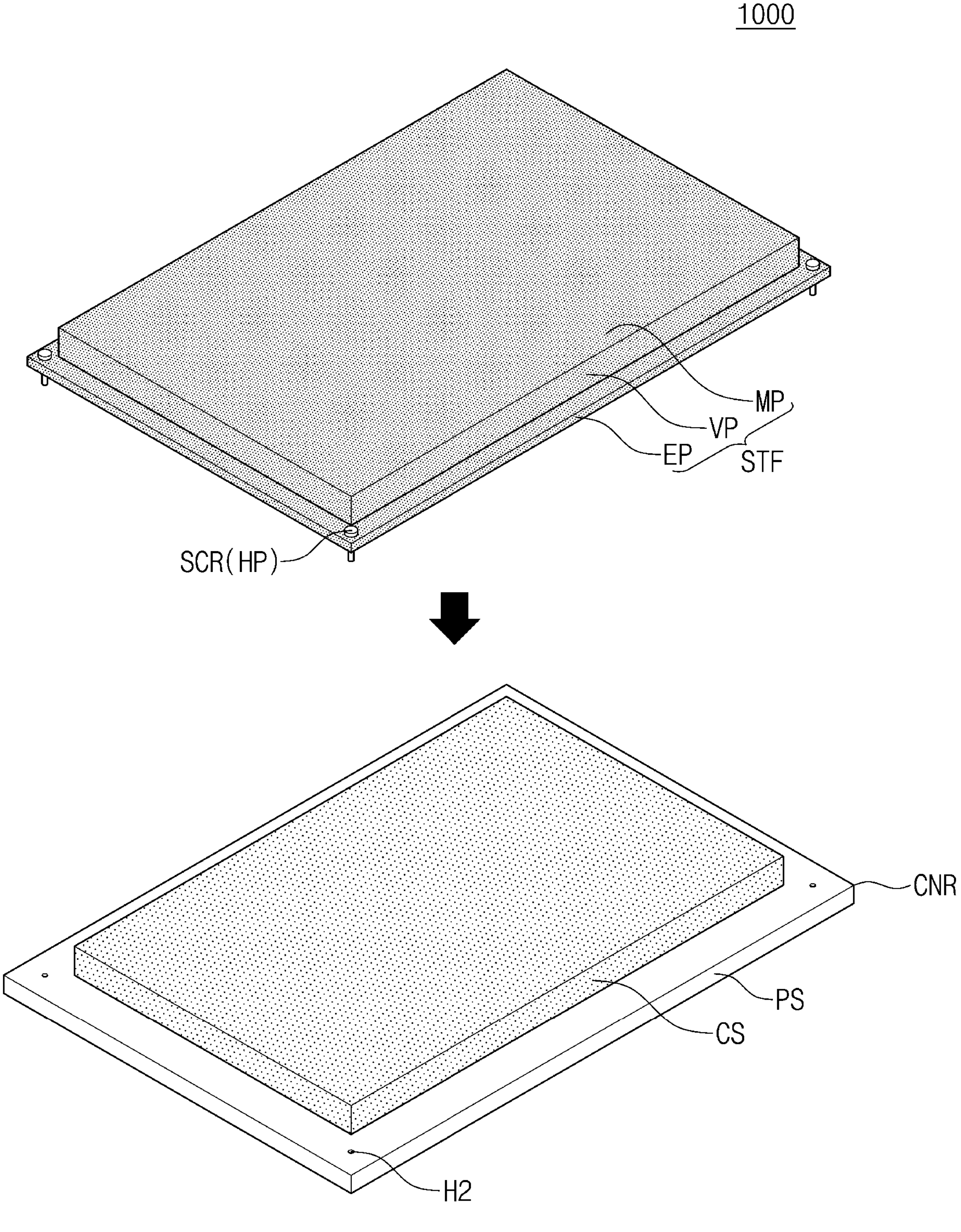
FIG. 6 is a perspective view of FIG. 5B according to an embodiment of the present inventive concept.

FIGS. 5A and 5B are views showing a process for manufacturing a semiconductor package having the cross-section of FIG. 2. FIG. 6 is a perspective view of FIG. 5B.

Referring to FIG. 5A, the chip structure CS is mounted on the first substrate PS using the internal connection members IB. The first underfill layer UF1 is formed between the first substrate PS and the chip structure CS (e.g., in the vertical direction, such as the Z direction). In an embodiment, the solder balls SB are then bonded to the lower surface of the first substrate PS. The second holes H2 may be formed adjacent to each corner CNR in the first substrate PS.

Referring to FIGS. 5B and 6, the thermal interface material layer TM is formed on the chip structure CS. For example, the thermal interface material layer TM may be formed directly on an upper surface of the chip structure CS. The first substrate PS on which the chip structure CS is mounted may be warped due to differences in thermal expansion coefficients of each component. The stiffener STF is placed on the chip structure CS. The screws SCR may then be coupled to the edge portion EP of the stiffener STF. For example, the screws SCR are inserted into the second holes H2 of the first substrate PS and the screws SCR are tightened to fasten the stiffener STF to the first substrate PS. In this embodiment, the warpage of the first substrate PS may be suppressed/controlled/minimized/alleviated by tightening the screws SCR. As a result, a semiconductor package 1000 with increased reliability may be provided.

Figure 7:
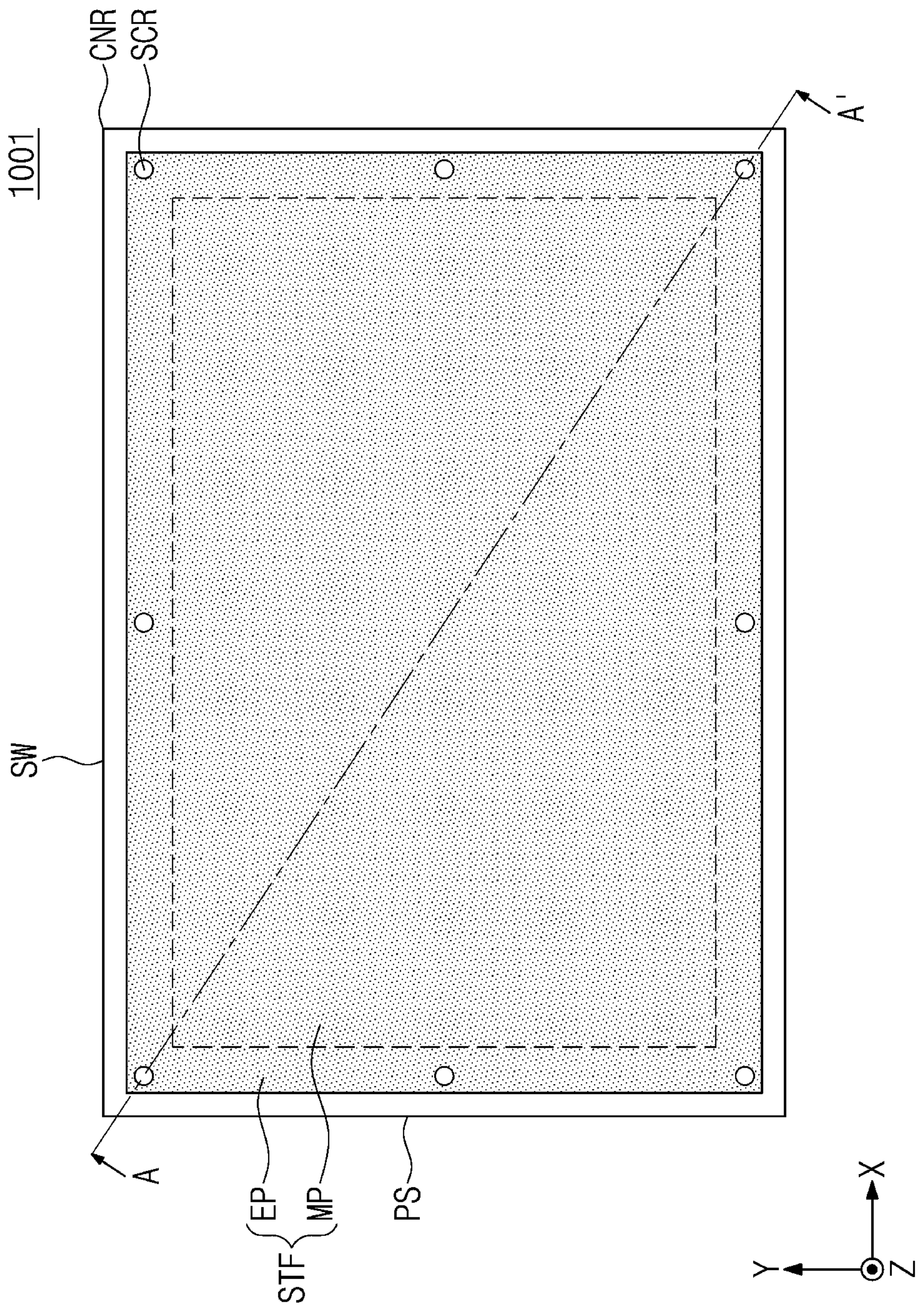
FIGS. 7 to 9 are plan views of semiconductor packages according to embodiments of the present inventive concept.
Figure 8:
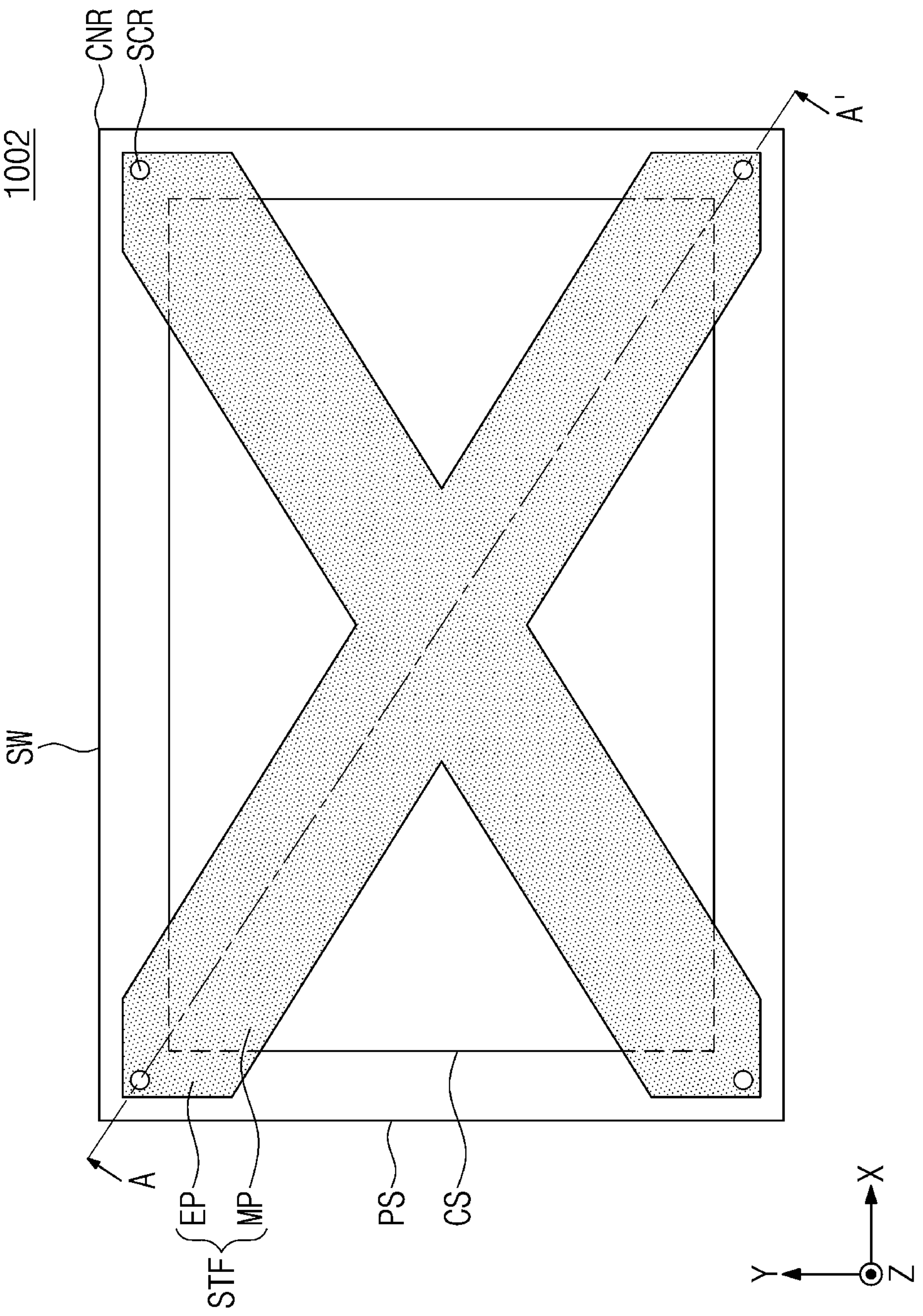
Figure 9:
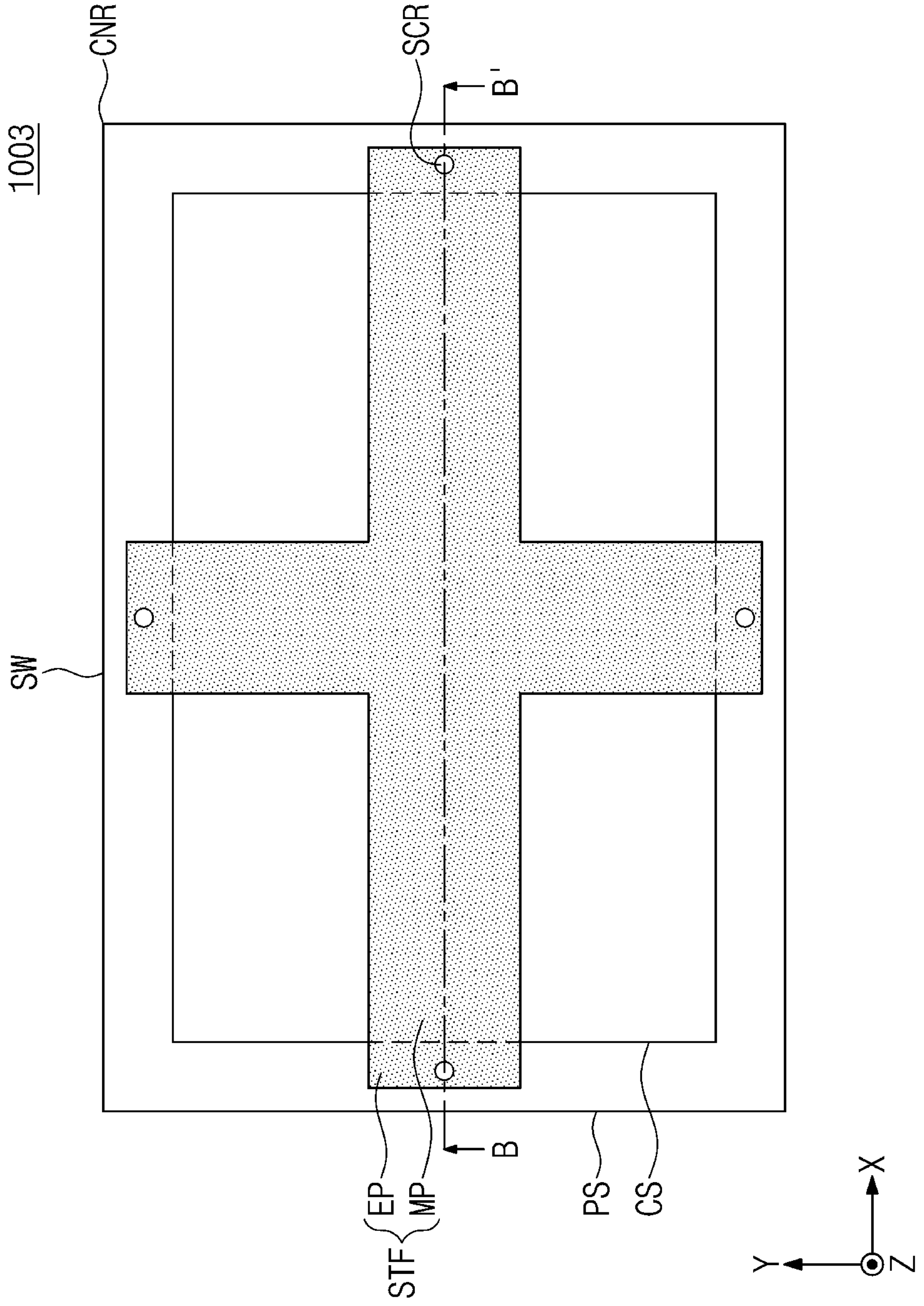

FIGS. 7 to 9 are plan views of semiconductor packages according to embodiments of the present inventive concept.

Referring to FIG. 7, in a semiconductor package 1001 according to this embodiment, the first substrate PS may have four side surfaces SW in a clockwise direction. The screws SCR may be disposed adjacent to the four corners CNR of the first substrate PS. Additionally, the screws SCR may be disposed adjacent to a center of the side surfaces SW of the first substrate PS. For example, in an embodiment as shown in FIG. 7, eight screws SCR may be provided. However, the number of screws SCR is not necessarily limited thereto and may vary.

Referring to FIG. 8, in a semiconductor package 1002 according to this embodiment, a plane of the stiffener STF may have an 'X' shape (e.g., in a plane defined in the X and Y directions). The screws SCR may be disposed adjacent to four corners CNR of the first substrate PS. In this embodiment, four screws SCR may be provided. However, embodiments of the present disclosure are not necessarily limited thereto. The cross section of FIG. 8 taken along line A-A' may be the same as that of FIG. 2. The main portion MP of the stiffener STF may partially cover an upper surface of the chip structure CS. For example, the upper surface of the chip structure CS may not be completely covered by the main portion MP of the stiffener STF but may be partially exposed. Additionally, a portion of the upper surface of the first substrate PS may be exposed. Other structures may be the same/similar to those described above.

Referring to FIG. 9, in a semiconductor package 1003 according to this example, a plane of the stiffener STF may have a '+' shape (e.g., a cross shape). In an embodiment, the screws SCR may be disposed adjacent to a center of side surfaces SW of the first substrate PS. In an embodiment shown in FIG. 9, four screws SCR may be provided. However, embodiments of the present disclosure are not necessarily limited thereto. The cross section of FIG. 9 taken along line B-B' may be the same as that of FIG. 2. The main portion MP of the stiffener STF may partially cover an upper surface of the chip structure CS. For example, the upper surface of the chip structure CS may not be completely covered by the main portion MP of the stiffener STF but may be partially exposed. Additionally, a portion of the upper surface of the first substrate PS may be exposed. Other structures may be the same/similar to those described above.

Figure 10:
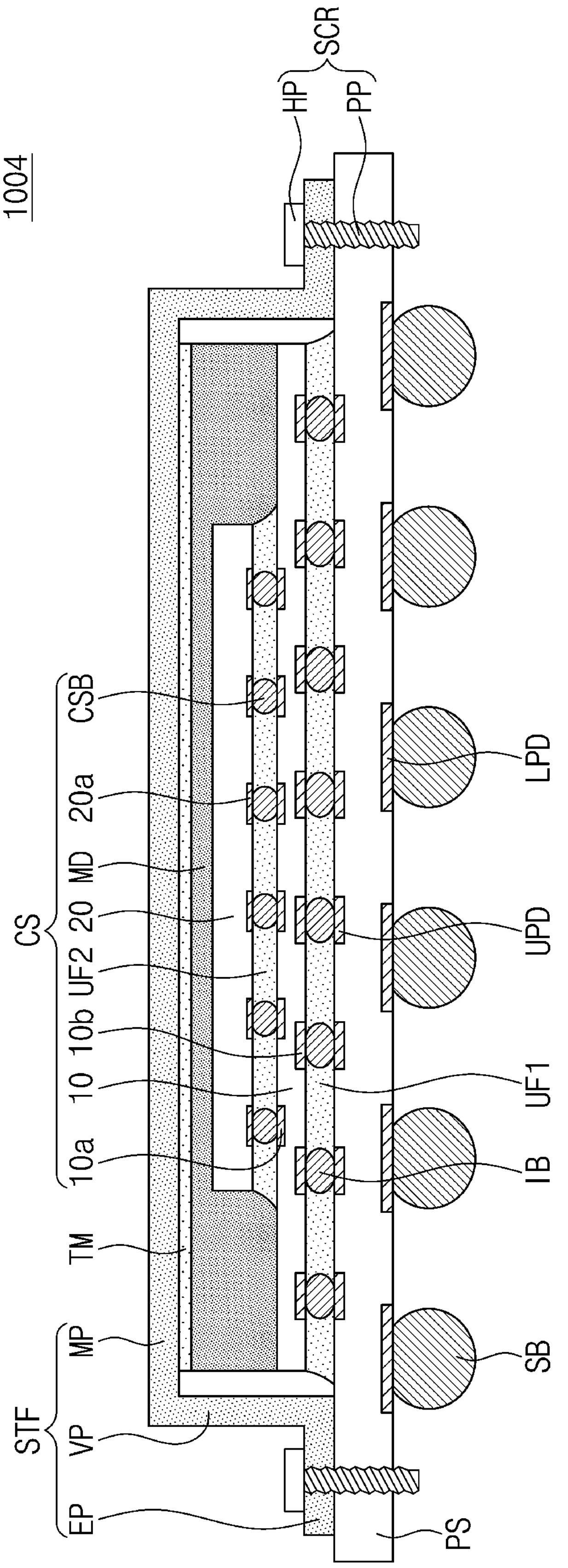
FIG. 10 is a cross-sectional view of a semiconductor package according to an embodiment of the present inventive concept.

FIG. 10 is a cross-sectional view of a semiconductor package according to an embodiment of the present inventive concept.

Referring to FIG. 10, in a semiconductor package 1004 according to this embodiment, the chip structure CS may include a second substrate 10, a semiconductor chip 20, and a mold layer MD. The second substrate 10 may also be called, for example, an 'interposer substrate', a 'redistribution substrate', or a 'chip substrate'. In an embodiment, the second substrate 10 may include silicon and/or an insulating layer. The second substrate 10 may include second substrate upper conductive pads 10*a* disposed on an upper surface thereof and second substrate lower conductive pads 10*b* disposed on a lower surface thereof. The second substrate lower conductive pads 10*b* may correspond to the chip conductive pads CPD of FIG. 2.

The semiconductor chip 20 may include chip conductive pads 20*a*. In an embodiment, the semiconductor chip 20 may be at least one selected from a system large-scale integration (LSI) chip, a logic circuit chip, an image sensor chip (e.g., a CMOS imaging sensor (CIS)), a memory chip (e.g., FLASH memory chip, DRAM chip, SRAM, chip EEPROM chip, PRAM chip, MRAM chip, ReRAM chip, high bandwidth memory (HBM), chip or hybrid memory cubic (HMC) chip), or a microelectromechanical system (MEMS) element chip, or an application-specific integrated circuit (ASIC) chip. Chip solder balls CSB may be interposed between the semiconductor chip 20 and the second substrate 10 (e.g., in the vertical direction, such as the Z direction). A space between the semiconductor chip 20 and the second substrate 10 may be filled with a second underfill layer UF2. The mold layer MD may cover the second substrate 10 and the semiconductor chip 20. For example, in an embodiment the mold layer MD may include an insulating resin such as epoxy-based molding compound (EMC). However, embodiments of the present disclosure are not necessarily limited thereto. The mold layer MD may further include a filler, and the filler may be dispersed in the insulating resin. In an embodiment, the filler may include, for example, silicon oxide ($SiO_2$). A side surface of the mold layer MD may be coplanar with a side surface of the second substrate 10. Other structures may be the same/similar to those described with reference to embodiments shown in FIGS. 1 to 4.

Figure 11:
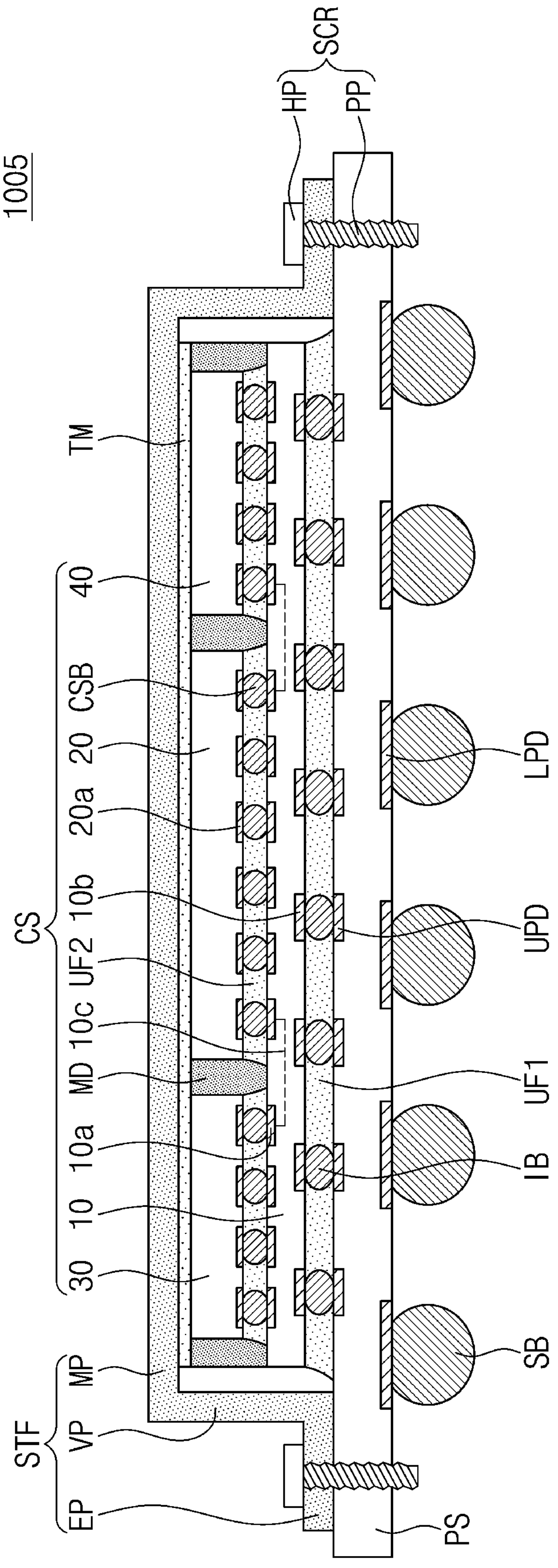
FIG. 11 is a cross-sectional view of a semiconductor package according to an embodiment of the present inventive concept.

FIG. 11 is a cross-sectional view of a semiconductor package according to an embodiment of the present inventive concept.

Referring to FIG. 11, in a semiconductor package 1005 according to an embodiment, a chip structure CS may include a second substrate 10, a first semiconductor chip 20, a second semiconductor chip 30, a third semiconductor chip 40, and a mold layer MD. In an embodiment, the first semiconductor chip 20 may be a large scale integration (LSI) chip, a logic circuit chip, a processor chip, or an application-specific integrated circuit (ASIC) chip. The second semiconductor chip 30 and the third semiconductor chip 40 may be memory chips such as a high bandwidth memory (HBM) chip or a hybrid memory cubic (HMC) chip. Connection wirings 10*c* are disposed in the second substrate 10 and electrically connect the second semiconductor chip 30 and the third semiconductor chip 40 to the first semiconductor chip 20. As a result, signal transmission speed between the second semiconductor chip 30 and the third semiconductor chip 40 and the first semiconductor chip 20 may be increased. The mold layer MD may cover lateral side surfaces of the first semiconductor chip 20, the second semiconductor chip 30, and the third semiconductor chip 40 while exposing upper surfaces thereof. In some embodiments, the number of the semiconductor chips disposed on the second substrate 10 may vary. Other structures may be the same/similar to those described with reference to an embodiment shown in FIG. 10.

Figure 12:
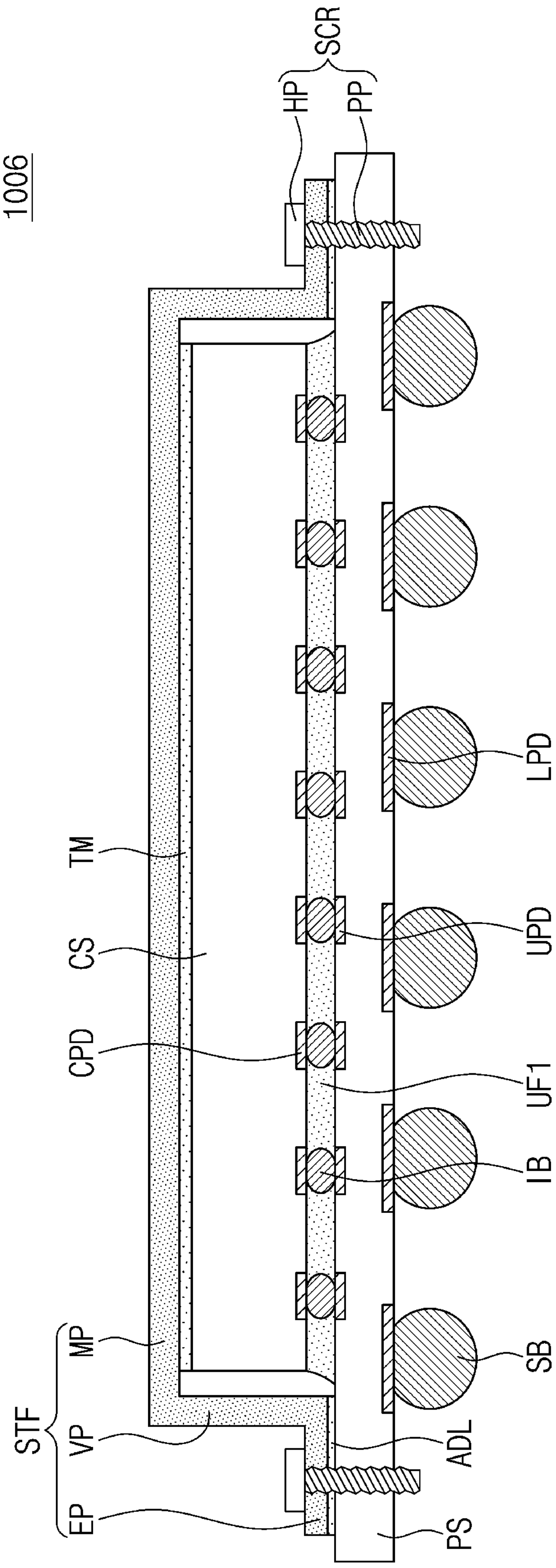
FIG. 12 is a cross-sectional view of a semiconductor package according to an embodiment of the present inventive concept.

FIG. 12 is a cross-sectional view of a semiconductor package according to an embodiment of the present inventive concept.

Referring to FIG. 12, in a semiconductor package 1006 according to an embodiment, an adhesive layer ADL may be interposed between the edge portion EP of the stiffener STF and the first substrate PS. The screws SCR may penetrate the adhesive layer ADL before penetrating the first substrate PS. Other structures may be the same/similar to those described with reference to embodiments shown in FIGS. 1 to 4.

Figure 13:
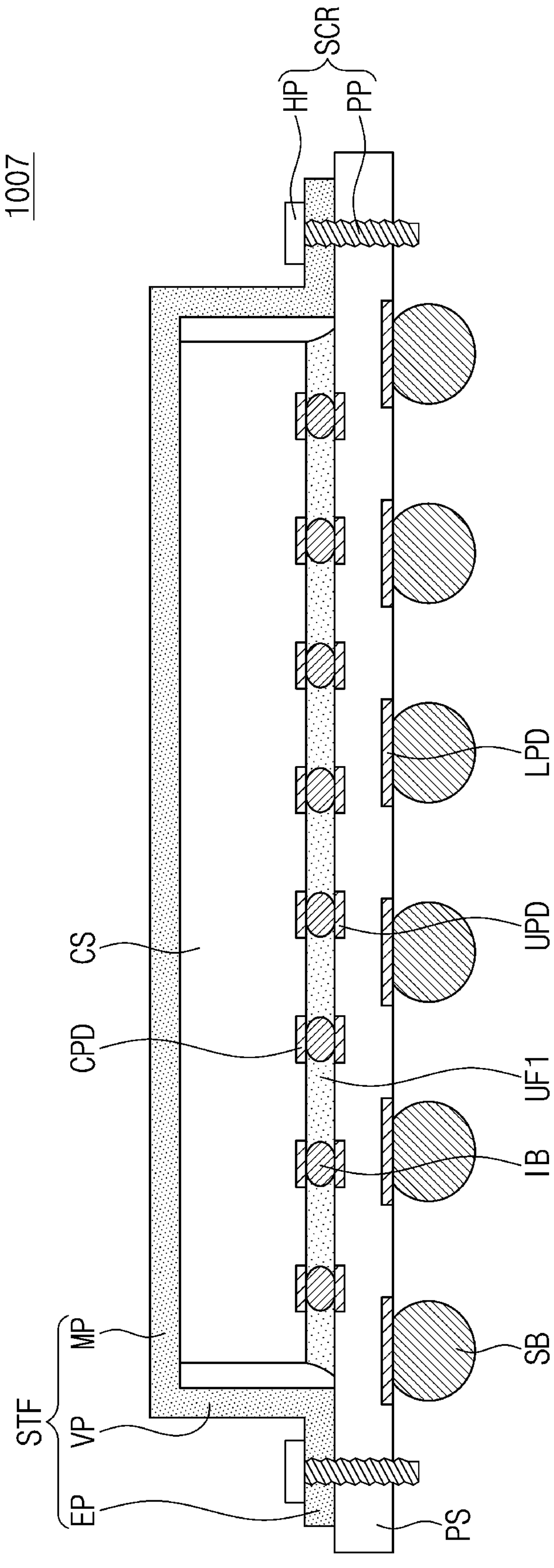
FIG. 13 is a cross-sectional view of a semiconductor package according to an embodiment of the present inventive concept.

FIG. 13 is a cross-sectional view of a semiconductor package according to embodiments of the present inventive concept.

Referring to FIG. 13, in a semiconductor package 1007 according to an embodiment, an upper surface of the chip structure CS is in direct contact with the main portion MP of the stiffener STF without the thermal interface material layer TM of FIG. 2 interposed therebetween (e.g., in the vertical direction, such as the Z direction). Other structures may be the same/similar to those described with reference to embodiments shown in FIGS. 1 to 4.

Figure 14:
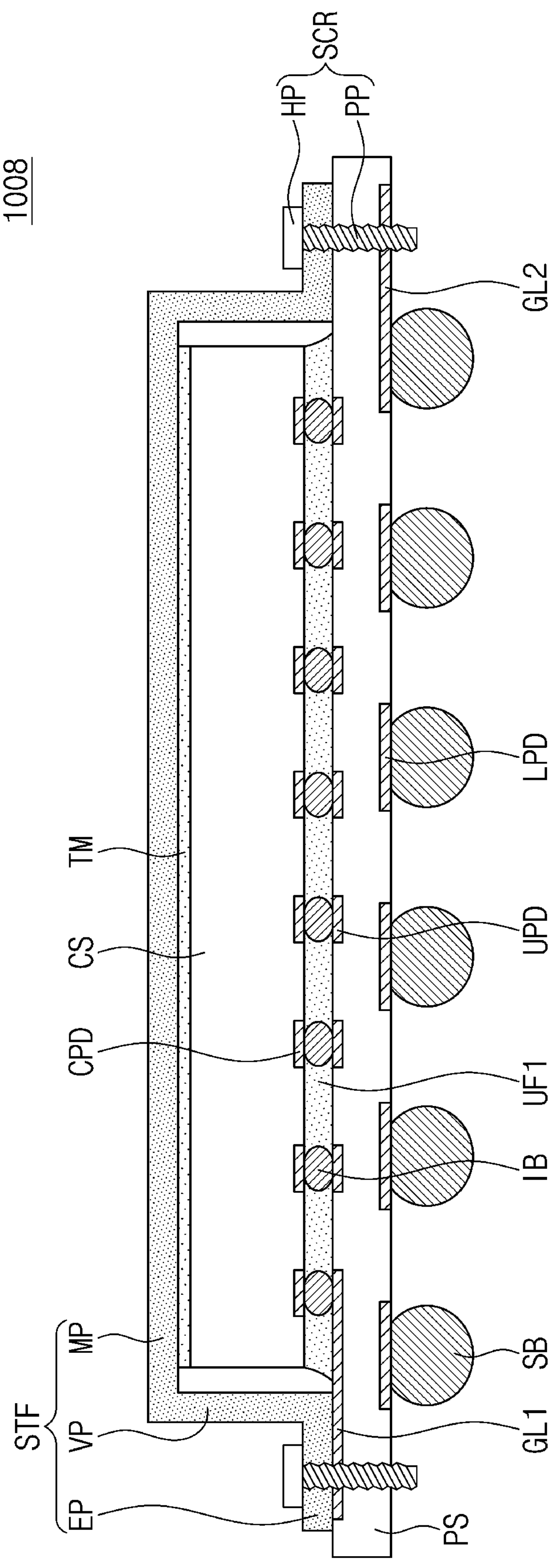
FIG. 14 is a cross-sectional view of a semiconductor package according to an embodiment of the present inventive concept.

FIG. 14 is a cross-sectional view of a semiconductor package according to embodiments of the present inventive concept.

Referring to FIG. 14, in a semiconductor package 1008 according to this embodiment, a first substrate PS includes a first ground wiring GL1 disposed on an upper surface thereof and a second ground wiring GL2 disposed on a lower surface thereof. In an embodiment, the first ground wiring GL1 and the second ground wiring GL2 may be formed of a conductive material. The first ground wiring GL1 and the second ground wiring GL2 may extend to the edge of the first substrate PS. The first ground wiring GL1 may be in direct contact with the edge portion EP of the stiffener STF. One of the screws SCR may penetrate the first ground wiring GL1 and be in direct contact with the first ground wiring GL1. The other one of the screws SCR may penetrate the second ground wiring GL2 and be in direct contact with the second ground wiring GL2. A ground voltage may be applied to the first ground wiring GL1 and the second ground wiring GL2. In an embodiment in which the stiffener STF is formed of a conductive material, a ground voltage may also be applied to the stiffener STF through the screws SCR. The stiffener STF may act as electromagnetic interference (EMI) shields.

Figure 15A:
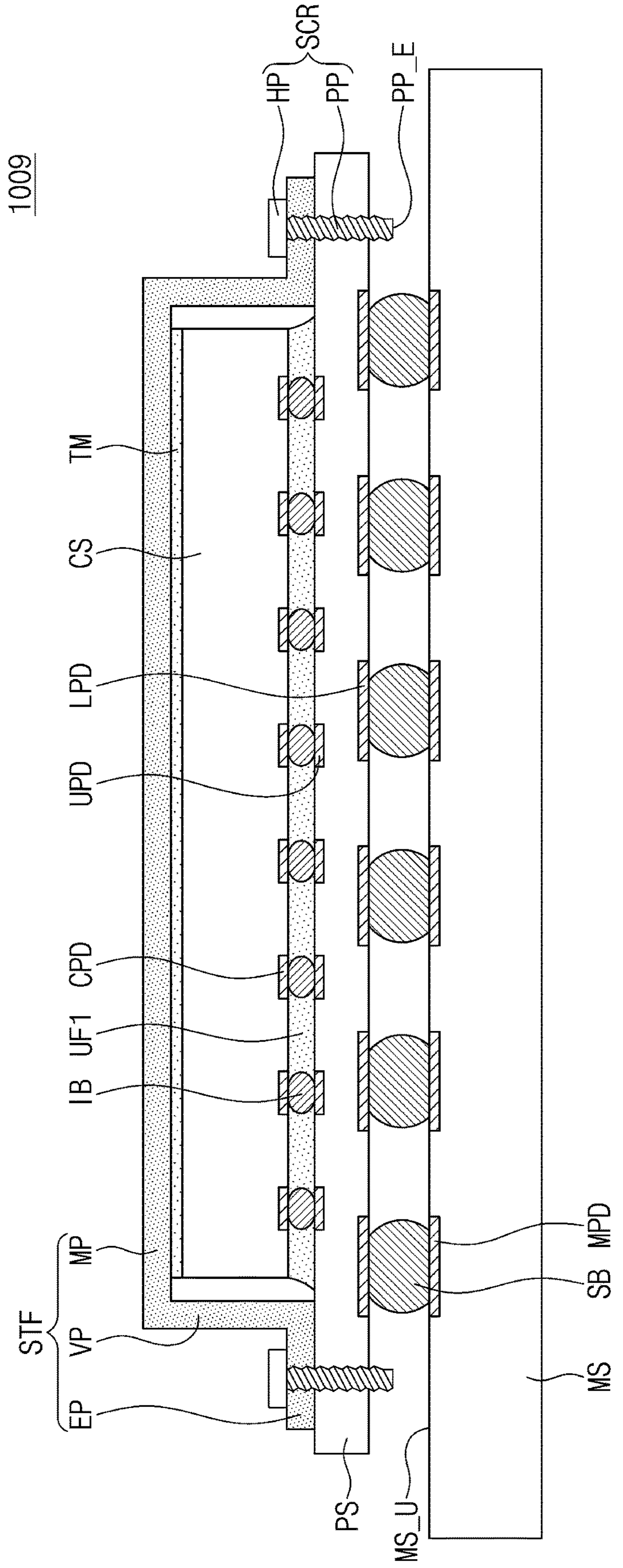
FIGS. 15A and 15B are cross-sectional views of semiconductor packages according to embodiments of the present inventive concept.
Figure 15B:
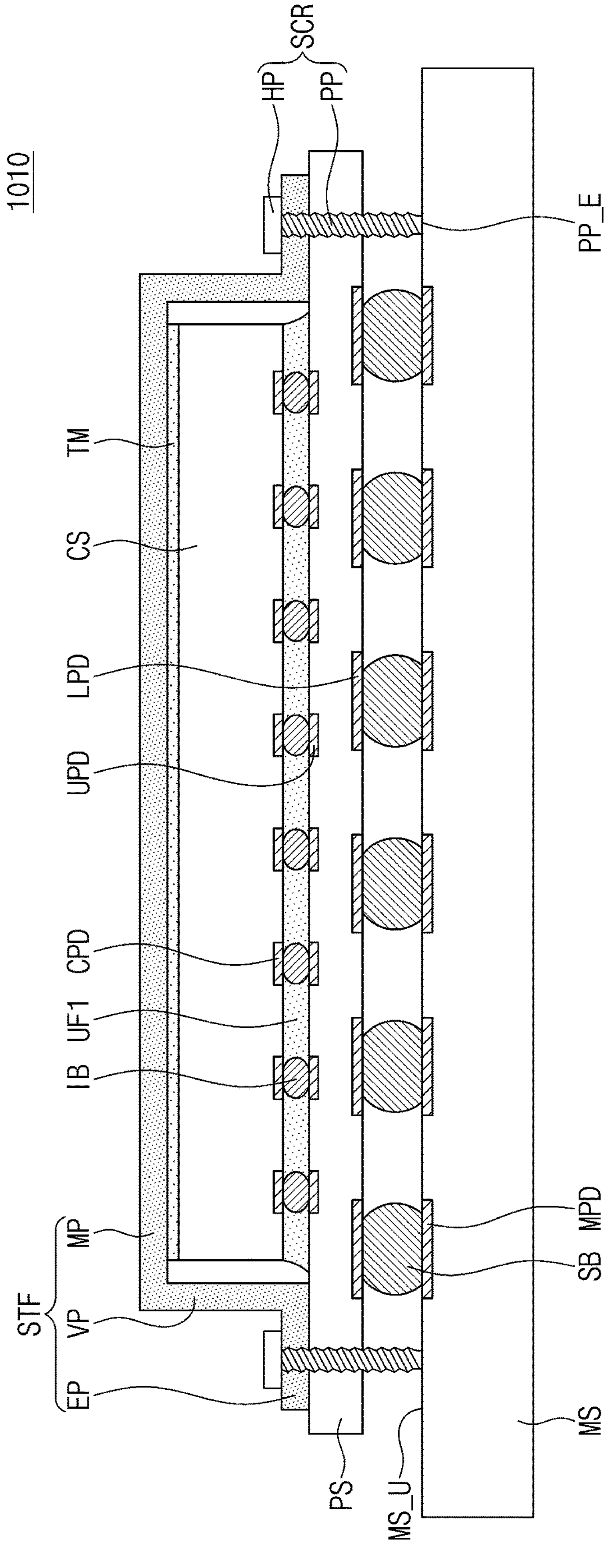

FIGS. 15A and 15B are cross-sectional views of semiconductor packages according to embodiments of the present inventive concept.

Referring to FIGS. 15A and 15B, semiconductor packages 1009 and 1010 according to an embodiment may further include a third substrate MS disposed below the first substrate PS in addition to the structure of the semiconductor package 1000 of FIG. 2. In an embodiment, the third substrate MS may be a double-sided or multi-layer printed circuit board. The third substrate MS may also be called a 'module substrate.' The semiconductor packages 1009 and 1010 may also be called 'semiconductor modules.' The third substrate MS may include third substrate upper conductive patterns MPD disposed on an upper surface MS_U thereof. Solder balls SB may be bonded to the third substrate upper conductive patterns MPD. In an embodiment, lower ends PP_E of the screws SCR may be spaced apart from the upper surface MS_U of the third substrate MS (e.g., in the vertical direction, such as the Z direction) as shown in FIG. 15A or may be in direct contact with the upper surface MS_U of the third substrate MS as shown in FIG. 15B.

The semiconductor packages 1009 and 1010 according to the embodiments shown in FIGS. 15A and 15B undergo a reflow process to melt the solder balls SB of the semiconductor package 1000 of FIG. 2 and apply pressure to an upper surface of the semiconductor package 1000 of FIG. 2, to bond the solder balls SB to the upper conductive patterns MPD of the third substrate MS. In an embodiment, during the reflow process, pillars PP of the screws SCR protruding from a lower surface of the first substrate PS may serve as a stopper to control a height of the bonded solder balls SB and may prevent the solder balls SB from being excessively distorted due to pressure to prevent a short between the solder balls SB. Therefore, a semiconductor package with increased reliability may be provided.

Figure 16:
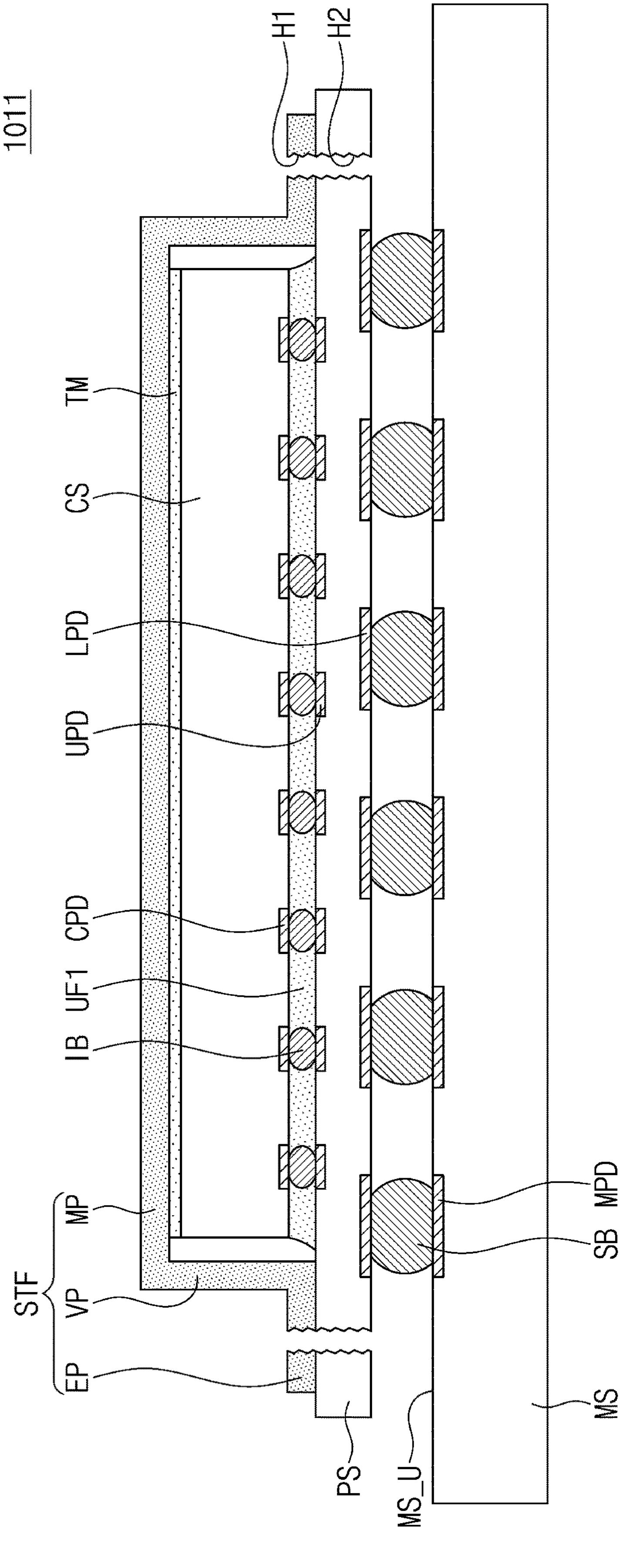
FIG. 16 is a cross-sectional view of a semiconductor package according to an embodiment of the present inventive concept.

FIG. 16 is a cross-sectional view of a semiconductor package according to an embodiment of the present inventive concept.

Referring to FIG. 16, a semiconductor package 1011 according to an embodiment may exclude screws SCR from the structure of the semiconductor packages 1009 and 1010 shown in FIGS. 15A and 15B. In the semiconductor package 1011 according to an embodiment, the second holes H2 of the first substrate PS and the first holes H1 of the stiffener STF may be aligned with each other, and the first holes H1 and the second holes H2 may be exposed without being filled with screws SCR. For example, in an embodiment the screws SCR may be initially screwed into the second holes H2 of the first substrate PS and the first holes H1 of the stiffener STF when manufacturing the semiconductor package 1000. However, after the semiconductor package 1000 of FIG. 2 is bonded to the third substrate MS through a reflow process, the screws SCR may be removed to manufacture the semiconductor package 1011 according to this embodiment.

The semiconductor package according to an embodiment of the present inventive concept may include the screws for fixing/fastening the stiffener to the package substrate, thereby effectively suppressing and controlling the warpage thereof. As a result, when the semiconductor package in which the solder balls are bonded through the reflow process is mounted on the module substrate, the non-wet problem of the solder balls may be solved and the semiconductor package with increased reliability may be provided.

In addition, in the semiconductor package according to an embodiment of the present inventive concept, the screws protruding below the package substrate may serve as the stopper to control the final height of the solder balls when mounting the semiconductor package to which the solder balls are bonded through the reflow process on the module substrate. This may prevent the short circuit between solder balls. The semiconductor package with increased reliability may be provided.

While non-limiting embodiments of the present inventive concept are described above, a person skilled in the art may understand that many modifications and variations are made without departing from the spirit and scope of the present inventive concept. Accordingly, the described embodiments of the present inventive concept should be considered in all respects as illustrative and not restrictive. Additionally, elements of the embodiments of FIGS. 1 through 16 can be combined with each other.

What is claimed is:

1. A semiconductor package comprising:
- a package substrate;
- a chip structure on the package substrate;
- a stiffener covering the chip structure and the package substrate;
- screws fixing the stiffener to the package substrate;
- a module substrate disposed on a lower surface of the substrate; and solder balls interposed between the package substrate and the module substrate, wherein the stiffener includes:

a main portion that covers an upper surface of the chip structure;

a vertical portion that covers lateral side surfaces of the chip structure, the vertical portion extending from an end of the main portion; and an edge portion extending laterally from the vertical portion and covering an upper surface of the package substrate, and wherein each of the screws includes a pillar portion penetrating the edge portion and the package substrate and coupling the edge portion to the package substrate, and wherein a lower end of the pillar portion contacts an upper surface of the module substrate.

2. The semiconductor package of claim 1, wherein the screws are disposed adjacent to corners of the package substrate, respectively.

3. The semiconductor package of claim 1, wherein each of the screws further includes:

a head portion protruding on the edge portion, wherein the pillar portion is connected from a lower surface of the head portion, the pillar portion extending into the edge portion and the package substrate, and including threads formed on a side surface of the pillar portion, and wherein each of the package substrate and the edge portion has holes having side profiles corresponding to the threads.

4. The semiconductor package of claim 3, wherein a lower end of the pillar portion protrudes below a lower surface of the package substrate.

5. The semiconductor package of claim 1, wherein the main portion of the stiffener partially covers an upper surface of the chip structure such that a portion of the upper surface of the chip structure is not covered by the stiffener.

6. The semiconductor package of claim 4, wherein adjacent solder balls of the solder balls are spaced apart from each other by a first distance, wherein an outermost solder ball of the solder balls is positioned closest to the pillar portion, and wherein the outermost solder ball and the pillar portion are separated from each other by a second distance, the second distance is in a range of about $1/3$ to about $2/3$ of the first distance.

7. The semiconductor package of claim 3, wherein:

the package substrate has a first width;

the edge portion has a second width, the head portion has a third width, and the second width is greater than the third width and less than about $2/100$ of the first width.

8. The semiconductor package of claim 1, further comprising a thermal interface material layer interposed between the chip structure and the main portion.

9. The semiconductor package of claim 1, further comprising an adhesive layer interposed between the package substrate and the edge portion, wherein the screws penetrate the adhesive layer.

10. The semiconductor package of claim 1, further comprising at least one ground wiring disposed on a lower surface, the upper surface, or an inside of the package substrate, wherein each of the at least one ground wiring is in contact with one of the screws, respectively.

11. The semiconductor package of claim 1, wherein the stiffener has a rectangular shape, an X-shape or a cross-shape when viewed in a plan view.

12. The semiconductor package of claim 1, wherein the chip structure includes:

a chip substrate on the package substrate;

at least one semiconductor chip on the chip substrate; and a mold layer covering the at least one semiconductor chip and the chip substrate.

13. The semiconductor package of claim 1, wherein the semiconductor chip includes a plurality of semiconductor chips, wherein the plurality of semiconductor chips include a first semiconductor chip and a second semiconductor chip, wherein the first semiconductor chip is a processor chip, wherein the second semiconductor chip is a memory chip, and wherein the chip substrate includes connection wirings electrically connecting the first semiconductor chip to the second semiconductor chip.

14. A semiconductor package comprising:

a package substrate;

a chip structure on the package substrate, the chip structure including a chip substrate, at least one semiconductor chip disposed on the chip substrate and a mold layer covering the chip substrate;

a stiffener covering the chip structure and the package substrate;

screws fixing the stiffener to the package substrate; and solder balls bonded to a lower surface of the package substrate, wherein the stiffener includes:

a main portion that covers an upper surface of the chip structure;

a vertical portion that covers lateral side surfaces of the chip structure, the vertical portion extending from an end of the main portion; and an edge portion extending laterally from the vertical portion and covering an upper surface of the package substrate, wherein each of the screws includes a pillar portion penetrating the edge portion and the package substrate and coupling the edge portion to the package substrate, wherein a lower end of at least one screw of the screws protrudes below the lower surface of the package substrate, wherein the solder balls are spaced apart from each other by a first distance, wherein an outermost solder ball of the solder balls is positioned closest to the pillar portion, and wherein the outermost solder ball and the pillar portion are separated from each other by a second distance, the second distance is in a range of about $1/3$ to about $2/3$ of the first distance.

15. The semiconductor package of claim 14, further comprising a module substrate disposed below the package substrate, the solder balls are bonded to the module substrate, wherein the at least one screw is in contact with the module substrate.

16. The semiconductor package of claim 14, further comprising a thermal interface material layer interposed between the chip structure and the main portion.

17. The semiconductor package of claim 14, further comprising at least one ground wiring disposed on a lower surface, the upper surface, or an inside of the package substrate, wherein each of the at least one ground wiring is in contact with one of the screws, respectively.

18. A semiconductor package comprising:

a package substrate;

a chip structure on the package substrate;

a stiffener covering the chip structure and the package substrate; and screws fixing the stiffener to the package substrate, wherein the stiffener includes:

a main portion that covers an upper surface of the chip structure;

a vertical portion that covers lateral side surfaces of the chip structure, the vertical portion extending from an end of the main portion; and an edge portion extending laterally from the vertical portion and covering an upper surface of the package substrate, wherein the screws penetrate the edge portion and the package substrate and couple the edge portion to the package substrate, wherein the chip structure includes:

a chip substrate on the package substrate;

a first semiconductor chip and a second semiconductor chip on the chip substrate; and a mold layer covering the first semiconductor chip, the second semiconductor chip and the chip substrate, wherein the first semiconductor chip is a processor chip, wherein the second semiconductor chip is a memory chip, wherein the chip substrate includes connection wiring electrically connecting the first semiconductor chip to the second semiconductor chip, and wherein the main portion of the stiffener partially covers an upper surface of the chip structure such that a portion of the upper surface of the chip structure is not covered by the stiffener.

19. The semiconductor package of claim 18, wherein the screws are disposed adjacent to corners of the package substrate, respectively.

20. The semiconductor package of claim 18, wherein:

the package substrate has a first width, the edge portion has a second width, each of the screws has a head portion protruding on the edge portion, the head portion has a third width, wherein the second width is greater than the third width and less than about 2/100 of the first width.

* * * * *